United States Patent
Choi et al.

(10) Patent No.: US 9,385,251 B2
(45) Date of Patent: Jul. 5, 2016

(54) FLEXIBLE SEMICONDUCTOR DEVICES AND METHODS OF MANUFACTURING THE SAME

(71) Applicant: SAMSUNG ELECTRONICS CO., LTD., Suwon-si (KR)

(72) Inventors: Jun-hee Choi, Seongnam-si (KR); Byoung-lyong Choi, Seoul (KR); Tae-ho Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/937,729

(22) Filed: Jul. 9, 2013

(65) Prior Publication Data

US 2014/0054599 A1 Feb. 27, 2014

(30) Foreign Application Priority Data

Aug. 27, 2012 (KR) .......................... 10-2012-0093884

(51) Int. Cl.
*H01L 29/15* (2006.01)
*H01L 31/0256* (2006.01)
(Continued)

(52) U.S. Cl.
CPC ........... *H01L 31/03044* (2013.01); *B82Y 20/00* (2013.01); *H01L 31/03529* (2013.01); *H01L 31/035218* (2013.01); *H01L 31/035236* (2013.01); *H01L 31/047* (2014.12); *H01L 31/1848* (2013.01); *H01L 31/1856* (2013.01); *H01L 31/1892* (2013.01);
(Continued)

(58) Field of Classification Search
CPC ...................... H01L 21/02458; H01L 21/0254

USPC .................. 257/76, E29.247; 438/94, 47
See application file for complete search history.

(56) References Cited

U.S. PATENT DOCUMENTS 5,683,783 A * 11/1997 Nguyen-Tuong et al. ..... 428/192
5,932,896 A * 8/1999 Sugiura et al. ................. 257/94
(Continued)

FOREIGN PATENT DOCUMENTS

KR           10-1082990 B1    11/2011

OTHER PUBLICATIONS

Chung, et al., "Transferable GaN Layers Grown on ZnO-Coated Graphene Layers for Optoelectronic Devices", Science 330, 655 (2010), DOI: 10.1126/science.1195403, Oct. 29, 2010, 4 pgs total.
(Continued)

*Primary Examiner* — Jami M Valentine
(74) *Attorney, Agent, or Firm* — Sughrue Mion, PLLC

(57) ABSTRACT

A flexible semiconductor device and a method of manufacturing the flexible semiconductor device are provided. The flexible semiconductor device may include at least one vertical semiconductor element that is at least partly embedded in a flexible material layer. The flexible semiconductor device may further include a first electrode formed on a first surface of the flexible material layer and a second electrode formed on a second surface of the flexible material layer. A method of manufacturing a flexible semiconductor device may include separating a flexible material layer, in which the at least one vertical semiconductor element is embedded, from a substrate by weakening or degrading an adhesive force between an underlayer and a buffer layer by using a difference in coefficients of thermal expansion of the underlayer and the buffer layer.

13 Claims, 17 Drawing Sheets

(51) Int. Cl.
  *H01L 31/0304* (2006.01)
  *H01L 33/32* (2010.01)
  *H01L 33/00* (2010.01)
  *H01L 31/18* (2006.01)
  *H01L 31/0352* (2006.01)
  *B82Y 20/00* (2011.01)
  *H01L 31/047* (2014.01)
  *H01L 25/075* (2006.01)
  *H01L 33/24* (2010.01)
  *H01L 33/56* (2010.01)

(52) U.S. Cl.
  CPC .......... *H01L 33/0075* (2013.01); *H01L 33/32* (2013.01); *H01L 25/0753* (2013.01); *H01L 33/0079* (2013.01); *H01L 33/24* (2013.01); *H01L 33/56* (2013.01); *H01L 2924/0002* (2013.01); *Y02E 10/544* (2013.01); *Y02P 70/521* (2015.11)

(56) References Cited

U.S. PATENT DOCUMENTS

| | | | |
|---|---|---|---|
| 6,627,921 | B2 | 9/2003 | Wong et al. |
| 7,176,108 | B2 | 2/2007 | Cayrefourcq et al. |
| 7,523,547 | B2 | 4/2009 | Dangel et al. |
| 8,435,842 | B2 * | 5/2013 | Hirano et al. ............... 438/158 |
| 8,847,229 | B2 * | 9/2014 | Suzuki et al. ............... 257/59 |
| 2003/0087467 | A1 | 5/2003 | Oohata et al. |
| 2007/0034848 | A1 * | 2/2007 | Liu .................................. 257/2 |
| 2007/0125421 | A1 | 6/2007 | Park et al. |
| 2010/0266561 | A1 | 10/2010 | Poznansky et al. |
| 2010/0283054 | A1 * | 11/2010 | Hirano et al. ............... 257/57 |
| 2010/0323497 | A1 | 12/2010 | Fournel |
| 2011/0042677 | A1 | 2/2011 | Suzuki et al. |
| 2012/0222732 | A1 | 9/2012 | Choi |
| 2012/0267638 | A1 | 10/2012 | Lee et al. |
| 2012/0286264 | A1 * | 11/2012 | Suzuki et al. ............... 257/43 |

OTHER PUBLICATIONS

Park, et al., "Printed Assemblies of Inorganic Light-Emitting Diodes for Deformable and Semitransparent Displays", Science 325, 977 (2009), DOI: 10.1126/science.1175690, Aug. 21, 2009, 6 pgs total.

Tae-Hee Han, et al; "Extremely efficient flexible organic light-emitting diodes with modified graphene anode"; Nature Photonics, LETTERS, vol. 6, Jan. 10, 2012; pp. 105-110.

Communication dated Jul. 24, 2015 issued by the European Patent Office in counterpart European Patent Application No. 13180535.0.

Kalluri R Sarma et al; "The Thermal Expansion Shear Separation (TESS) Technique for Producing Thin Self-Supporting Silicon Films for Low-Cost Solar Cells" IEEE Transactions on Electron Devices, vol. ED-27, No. 4, Apr. 1, 1980, XP001310342, pp. 651-656.

* cited by examiner

FLEXIBLE SEMICONDUCTOR DEVICES AND METHODS OF MANUFACTURING THE SAME

CROSS-REFERENCE TO RELATED APPLICATION

This application claims priority from Korean Patent Application No. 10-2012-0093884, filed on Aug. 27, 2012, in the Korean Intellectual Property Office, the disclosure of which is incorporated herein in its entirety by reference.

BACKGROUND

1. Field

Apparatuses and methods consistent with exemplary embodiments relate to flexible semiconductor devices and methods of manufacturing the same.

2. Description of the Related Art

An example of various semiconductor devices is an optoelectronic device which uses optoelectronic characteristics of a semiconductor material. Optoelectronic devices include devices that convert electric energy into optical energy and other devices that convert optical energy into electric energy. Examples of devices that convert electric energy into optical energy are luminous devices or light-emitting devices such as light-emitting diodes (LEDs) or a laser diodes (LDs). Examples of devices converting optical energy into electric energy are photovoltaic devices such as solar cells and photodiodes.

Optoelectronic devices that are based on inorganic semiconductors, particularly, light-emitting devices based on nitride semiconductors, have various advantages such as high efficiency, high luminance, and long lifespan. However, to manufacture light-emitting devices based on a nitride semiconductor, a monocrystalline nitride layer has to be epitaxially grown on a sapphire substrate or a silicon substrate. Accordingly, it is difficult to form a device having a shape that is variable (changeable) in various ways. Moreover, manufacturing costs thereof are relatively high, and it is difficult to manufacture a large size device.

SUMMARY

One or more exemplary embodiments may provide semiconductor devices having a shape that is variable (changeable) in various ways and methods of manufacturing the semiconductor devices.

One or more exemplary embodiments may provide semiconductor devices that may be manufactured at low costs and with a large size surface, and methods of manufacturing the same.

One or more exemplary embodiments may provide semiconductor devices having excellent optoelectronic characteristics (light-emitting characteristics or photovoltaic characteristics) and methods of manufacturing the same.

One or more exemplary embodiments may provide semiconductor devices that may be manufactured using relatively simple methods.

Additional exemplary aspects will be set forth in part in the description which follows and, in part, will be apparent from the description, or may be learned by practice of the presented exemplary embodiments.

According to an aspect of an exemplary embodiment, a flexible semiconductor device includes: a flexible material layer; at least one vertical semiconductor element that is embedded in the flexible material layer; a first electrode that is formed on a first surface of the flexible material layer and is electrically connected to a first region of the at least one vertical semiconductor element; and a second electrode that is formed on a second surface of the flexible material layer and is electrically connected to a second region of the at least one vertical semiconductor element.

The vertical semiconductor element may include a Group III-V based semiconductor.

The vertical semiconductor element may include at least one of GaN, InGaN, AlGaN, and AlInGaN, for example.

The vertical semiconductor element may have a pyramid shape or a rod shape.

The vertical semiconductor element may have a core-shell structure.

The vertical semiconductor element may include a first conductivity type semiconductor and a second conductivity type semiconductor. The first conductivity type semiconductor may be connected to the first electrode, and the second conductivity type semiconductor may be connected to the second electrode.

The vertical semiconductor element may further include an active layer between the first conductivity type semiconductor and the second conductivity type semiconductor.

A portion of the vertical semiconductor element may protrude from the flexible material layer.

The flexible semiconductor device may further include a buffer layer formed on a lower surface of the vertical semiconductor element. In this case, the first electrode may be electrically connected to the vertical semiconductor element via the buffer layer.

The buffer layer may include a Group III-V based semiconductor.

The buffer layer may include, for example, low-temperature (LT)-GaN or LT-AlN.

The buffer layer may have a structure that is extended between the first electrode and the flexible material layer, and the flexible semiconductor may further include a mask layer between the buffer layer and the flexible material layer, wherein the mask layer may have at least one opening region exposing a portion of the buffer layer, wherein the vertical semiconductor element may be disposed on an area of the buffer layer exposed by the opening region.

The buffer layer may have a patterned structure that is configured to respectively correspond to each of the vertical semiconductor elements.

The flexible material layer may include elastomer.

At least one of the first electrode and the second electrode may have a buckled structure.

The flexible semiconductor device may further include a supporting film on the second electrode.

The supporting film may include elastomer.

The flexible semiconductor device may be an optoelectronic device.

The vertical semiconductor element may be a light-emitting element, and the flexible semiconductor device may be a light-emitting device.

The vertical semiconductor element may be a photovoltaic element, and the flexible semiconductor device may be a photovoltaic device.

According to an aspect of another exemplary embodiment, a method of manufacturing a flexible semiconductor device includes: forming a stack layer on a substrate, the stack layer having a structure in which an underlayer having a first coefficient of thermal expansion (CTE) and a buffer layer having a second CTE are sequentially stacked; defining at least one unit region on the stack layer; forming a vertical semiconductor element on the buffer layer corresponding to the unit region; weakening an adhesive force between the underlayer and the buffer layer by inducing stress due to a difference in the first and second CTEs of the underlayer and the buffer layer; forming a flexible material layer on the substrate so as to embed the vertical semiconductor element in the flexible material layer; and separating the flexible material layer in which the vertical semiconductor element is embedded, from the underlayer, together with the buffer layer.

A difference between the first CTE of the underlayer and the second CTE of the buffer layer may be about 1.5 times or more.

The underlayer may include a metal.

The underlayer may include at least one of Ti, Hf, Zr, and Al, for example.

The buffer layer may include a Group III-V based semiconductor.

The buffer layer may be formed at a low temperature of about 450° C. to about 650° C.

The buffer layer may include, for example, LT-GaN or LT-AlN.

The defining of at least one unit region on the stack layer may include forming a mask layer having at least one opening region exposing a portion of the buffer layer, on the buffer layer. In this case, the at least one opening region may correspond to the at least one unit region.

The defining of at least one unit region on the stack layer may include patterning the stack layer into at least one unit pattern. In this case, the at least one unit pattern may correspond to the at least one unit region.

The vertical semiconductor element may include a Group III-V based semiconductor.

At least a portion of the vertical semiconductor element may be formed at a high temperature of about 900° C. to about 1100° C.

The vertical semiconductor element may include, for example, at least one of GaN, InGaN, AlGaN, and AlInGaN.

The vertical semiconductor element may have a core-shell structure.

The vertical semiconductor element may include a first conductivity type semiconductor and a second conductivity type semiconductor or may include a first conductivity type semiconductor, a second conductivity type semiconductor, and an active layer formed between the first conductivity type semiconductor and the second conductivity type semiconductor.

The weakening an adhesive force between the underlayer and the buffer layer may include: heating the underlayer and the buffer layer; and cooling the underlayer and the buffer layer.

The cooling of the underlayer and the buffer layer may be performed, for example, at a speed of about 5° C./min or higher or about 10° C./min or higher.

The cooling of the underlayer and the buffer layer may be performed, for example, at a speed of about 5° C./min to about 10° C./min or about 10° C./min to about 30° C./min.

In the weakening an adhesive force between the underlayer and the buffer layer, a gap may be formed between the underlayer and the buffer layer.

The flexible material layer may be formed to fill at least a portion of the gap.

The method may further include etching a portion of the flexible material layer so as to expose a portion of the vertical semiconductor element.

The method may further include: forming an upper electrode electrically connected to the vertical semiconductor element on an upper surface of the flexible material layer; and forming a lower electrode electrically connected to the vertical semiconductor element on a lower surface of the flexible material layer.

At least one of the lower electrode and the upper electrode may be formed to have a buckled structure.

The at least one of the lower electrode and the upper electrode may be formed while extending the flexible material layer in opposite directions.

The method may further include, after forming the flexible material layer, attaching a supporting film on the flexible materials layer. In this case, the flexible material layer may be separated from the underlayer while the supporting film is attached onto the flexible material layer.

The method may further include, after forming the flexible material layer: forming an upper electrode on the flexible material layer; and forming a supporting film on the upper electrode. In this case, the flexible material layer may be separated from the underlayer while the upper electrode and the supporting film are attached onto the flexible material layer.

The substrate may be an amorphous substrate.

The substrate may be, for example, a glass substrate.

The flexible semiconductor device may be an optoelectronic device.

The vertical semiconductor element may be a light-emitting element, and the flexible semiconductor device may be a light-emitting device.

The vertical semiconductor element may be a photovoltaic element, and the flexible semiconductor device may be a photovoltaic device.

According to an aspect of another exemplary embodiment, a method of manufacturing a flexible semiconductor device includes: forming at least one vertical semiconductor element on a substrate; forming a flexible material layer on the substrate so as to embed the at least one vertical semiconductor element in the flexible material layer; separating the flexible material layer in which the at least one vertical semiconductor element is embedded, from the substrate; and forming an electrode element electrically connected to the at least one vertical semiconductor element.

The substrate may be an amorphous substrate.

The substrate may be, for example, a glass substrate.

The method may further include: forming a first material layer having a first coefficient of thermal expansion (CTE) on the substrate; and forming a second material layer having a second CTE on the first material layer. In this case, the vertical semiconductor element may be formed on the second material layer.

The separating the flexible material layer from the substrate may include: weakening an adhesive force between the first material layer and the second material layer by inducing generating stress due to a difference in the first and second CTEs of the first material layer and the second material layer; and separating the flexible material layer from the first material layer, together with the second material layer.

The weakening an adhesive force between the first material layer and the second material layer may include: heating the first material layer and the second material layer; and cooling the first material layer and the second material layer.

The vertical semiconductor element may include a Group III-V based semiconductor.

The vertical semiconductor element may have a core-shell structure.

The flexible semiconductor device may be an optoelectronic device.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
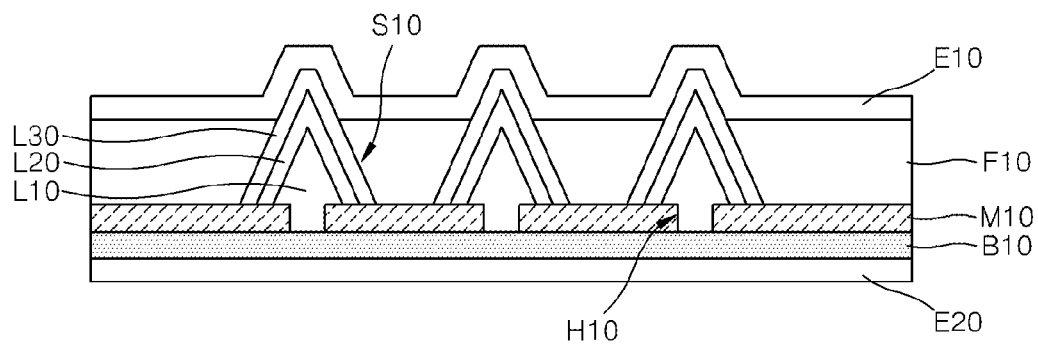
FIGS. 1 through 4 are cross-sectional views illustrating flexible semiconductor devices according to exemplary embodiments.

Reference will now be made in detail to exemplary embodiments which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Various exemplary embodiments will now be described more fully with reference to the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments and intermediate structures. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, flexible semiconductor devices and methods of manufacturing the same will be described in detail with reference to the attached drawings. Widths and thicknesses of layers or areas illustrated in the drawings may be exaggerated to some extent for clarity of the specification. Like reference numerals throughout the specification denote like elements.

FIG. 1 is a cross-sectional view illustrating a flexible semiconductor device according to an embodiment.

Referring to FIG. 1, the flexible semiconductor device according to the current embodiment may include a flexible material layer F10 and at least one vertical semiconductor element S10 that is embedded in the flexible material layer F10. A plurality of vertical semiconductor elements S10 that are spaced apart from one another may be included in the flexible material layer F10. The flexible material layer F10 may include an elastomer. The elastomer may be an elastic polymer. For example, the elastomer may include at least one of polydimethylsiloxane (PDMS), polyurethane, polyester, and a mixture of these. The flexible material layer F10 may be transparent.

The vertical semiconductor element S10 may have a pyramid shape or a similar shape thereto. Alternatively, the vertical semiconductor element S10 may be rod-shaped or have a similar shape thereto. The shape of the vertical semiconductor element S10 is not limited to a pyramid shape or a rod shape, and may be modified in various ways. The vertical semiconductor element S10 may have a core-shell structure. For example, the vertical semiconductor element S10 may include a first conductivity type semiconductor L10 and a second conductivity type semiconductor L30 surrounding the first conductivity type semiconductor L10. The first conductivity type semiconductor L10 may be referred to as a core portion, and the second conductivity type semiconductor L30 may be referred to as a shell portion. The vertical semiconductor element S10 may further include an active layer L20 that is included between the first conductivity type semiconductor L10 and the second conductivity type semiconductor L30. The active layer L20 may surround the first conductivity type semiconductor L10. In this respect, the active layer L20 may be referred to as a middle shell portion.

The vertical semiconductor element S10 may include an inorganic semiconductor. For example, the vertical semiconductor element S10 may include a Group III-V based compound semiconductor. The vertical semiconductor element S10 may include a GaN-based semiconductor, for example, at least one of GaN, InGaN, AlGaN, and AlInGaN. In detail, for example, the first conductivity type semiconductor L10 may include n-type GaN, and the second conductivity type semiconductor L30 may include p-type GaN. Alternatively, the first conductivity type semiconductor L10 may include p-type GaN, and the second conductivity type semiconductor L30 may include n-type GaN. The active layer L20 may have a stacked structure in which a quantum well layer and a barrier layer are alternately stacked at least once. The active layer L20 may have a single quantum well (SQW) structure or a multi-quantum well (MQW) structure. In detail, for example, the active layer L20 may have an MQW structure in which an InGaN layer (quantum well layer) and a GaN layer (barrier layer) are alternately and repeatedly stacked. However, this is exemplary, and the structure of the active layer L20 may be various ones. Also, although not shown in FIG. 1, the vertical semiconductor element S10 may further include a predetermined superlattice structure layer. The superlattice structure layer is well-known in the art, and thus, description thereof is omitted. According to circumstance, the active layer L20 may not be included. If the active layer L20 is not included, the vertical semiconductor element S10 may be regarded as having a PN structure.

A portion of the vertical semiconductor element S10 may protrude from the flexible material layer F10. For example, an upper portion of the vertical semiconductor element S10 may protrude out of an upper surface of the flexible material layer F10. About a fifth (⅕) to a half (½) of the vertical semiconductor element S10 may protrude out of the flexible material layer F10. Consequently, a central portion of the vertical semiconductor element S10 may be surrounded by the flexible material layer F10.

An upper electrode E10 that is electrically connected to the vertical semiconductor element S10 may be disposed on one side (upper surface portion) of the flexible material layer F10. A lower electrode E20 that is electrically connected to the vertical semiconductor element S10 may be disposed on the other side (lower surface portion) of the flexible material layer F10. The upper electrode E10 may be electrically connected to a first region of the vertical semiconductor element S10, and the lower electrode E20 may be electrically connected to a second region of the vertical semiconductor element S10. The upper electrode E10 may be electrically connected to the second conductivity type semiconductor L30 of the vertical semiconductor element S10, and the lower electrode E20 may be electrically connected to the first conductivity type semiconductor L10 of the vertical semiconductor element S10. One of the upper electrode E10 and the lower electrode E20 may be referred to as a first electrode, and the other may be referred to as a second electrode.

A buffer layer B10 may be further included between the lower electrode E20 and the flexible material layer F10. The buffer layer B10 may have a structure extending between the flexible material layer F10 and the lower electrode E20. The buffer layer B10 may function as a seed layer to grow the vertical semiconductor element S10. Due to the buffer layer B10, the vertical semiconductor element S10 may have excellent crystallinity. The buffer layer B10 may include a Group III-V based compound semiconductor. For example, the buffer layer B10 may be formed to include at least one of GaN, AlN, InGaN, AlGaN, and AlInGaN. In more detail, for example, the buffer layer B10 may include a GaN-based semiconductor or an AlN-based semiconductor. In this case, the buffer layer B10 may include a low temperature (LT)-GaN or a material based on LT-GaN, or may include a low temperature (LT)-AlN or a material based on LT-AlN. The LT-GaN and LT-AlN may be materials that are formed at a relatively low temperature, for example, from about 450° C. to about 650° C.

A mask layer M10 may be further included between the buffer layer B10 and the flexible material layer F10. The mask layer M10 may include at least one opening region H10 that exposes a portion of the buffer layer B10. The opening region H10 may have a hole shape. The vertical semiconductor element S10 may be formed on the portion of the buffer layer B10 that is exposed by the opening region H10. Thus, the vertical semiconductor element S10 and the buffer layer B10 may be in contact via the opening region H10 in the mask layer M10. The mask layer M10 may be formed of, for example, silicon oxide, silicon nitride, or the like. The mask layer M10 may have a thickness of about 10 nm to about 500 nm, for example, from about 10 nm to about 200 nm.

At least a portion of the vertical semiconductor element S10 formed on the portion of the buffer layer B10 exposed by the opening region H10 may include a high temperature (HT)-GaN or a material based on HT-GaN. The HT-GaN may be formed at a relatively high temperature of, for example, about 900° C. to about 1100° C. The first conductivity semiconductor L10 and the second conductivity type semiconductor L30 of the vertical semiconductor element S10 may be formed at a relatively high temperature of, for example, 900° C. to about 1100° C. The temperature at which the active layer L20 is formed may be somewhat lower than a temperature at which the first and second conductivity type semiconductors L10 and L30 are formed. For example, when the active layer L20 having an MQW structure in which an InGaN layer (quantum well layer) and a GaN layer (barrier layer) are alternately and repeatedly stacked is formed, the InGaN layer (quantum well layer) may be formed at a temperature of about 600° C. to about 850° C., and the GaN layer (barrier layer) may be formed at a temperature of about 700° C. to about 900° C. As such, when the active layer L20 is formed at a relatively low temperature (e.g., 600-900° C.), the active layer L20 may be formed to cover an upper surface of the mask layer M10. In this case, the second conductivity type semiconductor L30 may be formed on the entire surface of the active layer L20 which covers the upper surface of the mask layer M10. In other words, the active layer L20 and the second conductivity type semiconductor L30 may have a structure extending between the mask layer M10 and the flexible material layer F10.

At least one of the upper electrode E10 and the lower electrode E20 may be a transparent electrode. Both the upper electrode E10 and the lower electrode E20 may be transparent electrodes. The transparent electrode may be formed of, for example, graphene or a transparent conductive oxide (TCO) such as indium tin oxide (ITO). One of the upper electrode E10 and the lower electrode E20 may be a transparent electrode, and the other may be an opaque electrode. The opaque electrode may be formed of, for example, Au, Pd, Al, Pt, Ag, Ti, or a mixture of these materials. However, the materials for forming the upper and lower electrodes E10 and E20 are exemplary and other various conductive materials may be used to form the upper and lower electrodes E10 and E20.

Figure 2:
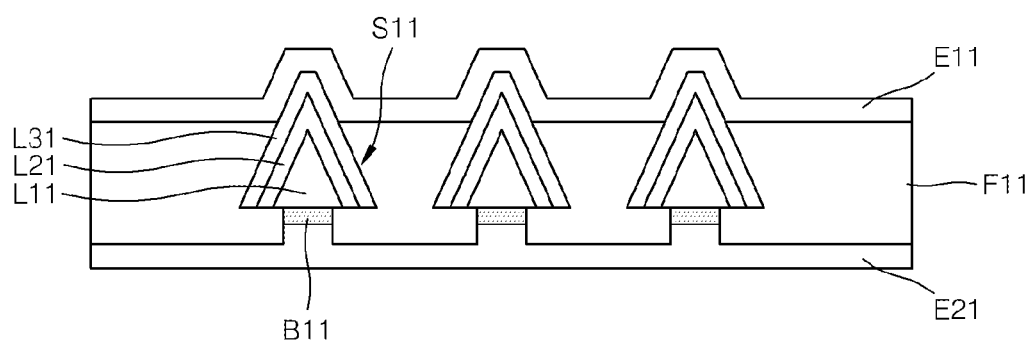

The structure of FIG. 1 may be modified in various manners. For example, the mask layer M10 having the opening region H10 is formed on the buffer layer B10 to define an area where the vertical semiconductor element S10 is to be formed, but according to another embodiment, the buffer layer B10 may be patterned without using the mask layer M10 to define an area where the vertical semiconductor element S10 is to be formed. This example is illustrated in FIG. 2. FIG. 2 illustrates a flexible semiconductor device according to another exemplary embodiment.

Referring to FIG. 2, a buffer layer B11 may be formed on a lower surface of a vertical semiconductor element S11. The buffer layer B11 may have a structure of patterns that respectively correspond to each of the vertical semiconductor elements S11. In this case, a lower electrode E21 may be formed on a lower surface of a flexible material layer F11 to contact the buffer layer B11. The lower electrode E21 may be electrically connected to the vertical semiconductor element S11 via the buffer layer B11. The upper electrode E11 may be formed on an upper surface of the flexible material layer F11 to be electrically connected to the vertical semiconductor element S11. The vertical semiconductor element S11 may include a first conductivity type semiconductor L11 and a second conductivity type semiconductor L31, and an active layer L21 may be included therebetween. According to circumstance, the active layer L21 may not be included. Materials, structure, and characteristics of the vertical semiconductor element S11 in detail may be substantially the same as or similar to those of the vertical semiconductor element S10 described with reference to FIG. 1. Materials, structures, and characteristics of the flexible material layer F11, the upper electrode E11, and the lower electrode E21 may be substantially the same as or similar to those of the flexible material layer F10, the upper electrode E10, and the lower electrode E20, respectively.

Figure 3:
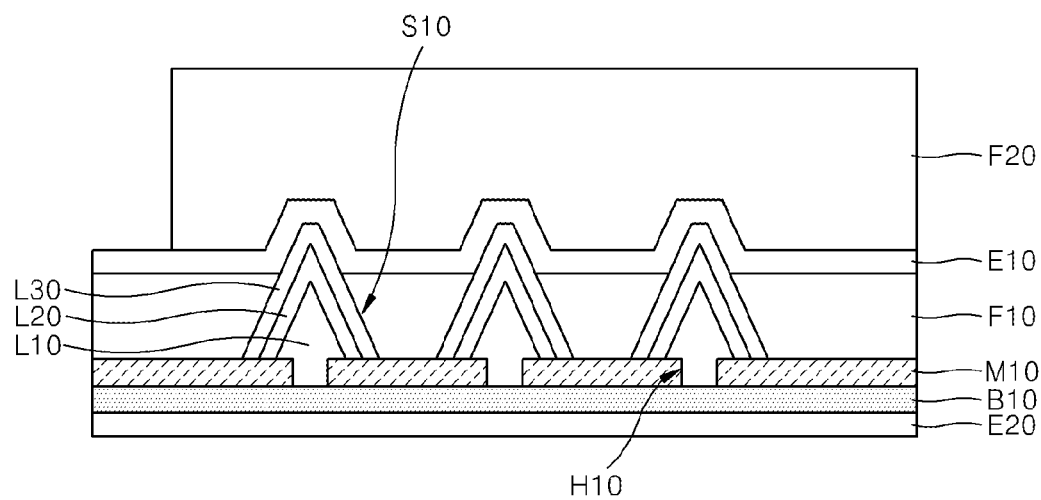

FIG. 3 is a cross-sectional view illustrating a flexible semiconductor device according to another exemplary embodiment. FIG. 3 illustrates a modified example of FIG. 1.

Referring to FIG. 3, a supporting film F20 may be further included on the upper electrode E10. The supporting film F20 may include elastomer. The elastomer may be elastic polymer. For example, the elastomer may include at least one of PDMS, polyurethane, polyester, and a mixture thereof. The supporting film F20 may be flexible like the flexible material layer F10. In this respect, the supporting film F20 may be referred to as a second flexible material layer. The supporting film F20 may be thicker than the flexible material layer F10. A portion of the upper electrode E10 may not necessarily be covered by the supporting film F20 but may be exposed. The portion of the upper electrode E10 that is not covered by the supporting film F20 but exposed may be a contact area. As in the current embodiment, when the flexible material layer F10 and the vertical semiconductor element S10 are supported by the supporting film F20, the flexible semiconductor device may have a more stable structure.

FIG. 3 illustrates the supporting film F20 applied to the structure of FIG. 1. However, the supporting film F20 of FIG. 3 may also be applied to the structure of FIG. 2. Also, according to circumstance, the supporting film F20 may be applied not on the upper electrodes E10 and E11 but under the lower electrodes E20 and E21. Alternatively, a first supporting film may be applied on an upper surface of the upper electrodes E10 and E11, and a second supporting film may be applied on a lower surface of the lower electrodes E20 and E21.

Figure 4:
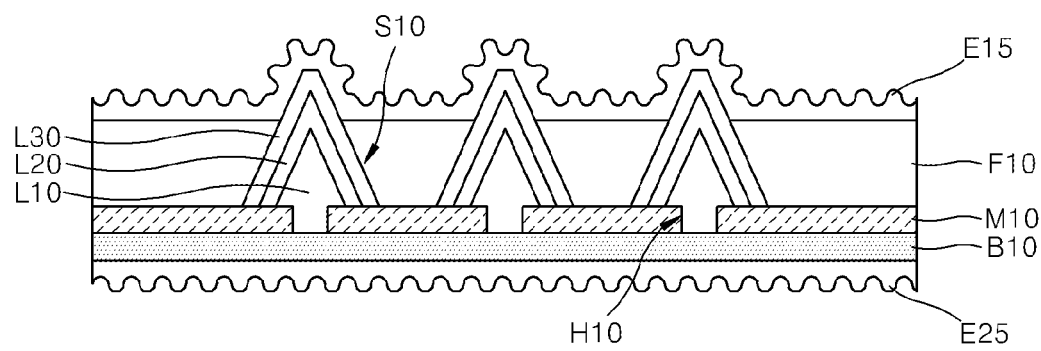

At least one of the upper electrodes E10 and E11 and the lower electrodes E20 and E21 of FIGS. 1 through 3 may have a buckled (or corrugated) structure. The buckled structure refers to a structure having a corrugated surface (wrinkled surface). An example of a flexible semiconductor device including the buckled structure is illustrated in FIG. 4. FIG. 4 illustrates a flexible semiconductor device including the upper electrode E10 and the lower electrode E20 of FIG. 1 each having a buckled structure, according to another exemplary embodiment.

Referring to FIG. 4, an upper electrode E15 and a lower electrode E25 each have a buckled structure. That is, the upper electrode E15 and the lower electrode E25 may both have corrugated surfaces. If the upper electrode E15 and the lower electrode E25 have buckled structures, when the flexible semiconductor device is bent or stretched (extended), the upper electrode E15 and the lower electrode E25 may be easily deformed flexibly.

However, the upper electrodes E10 and E11 and the lower electrodes E20 and E21 of FIGS. 1 through 3 may not necessarily have a buckled structure as illustrated in FIG. 4. If materials of the upper electrodes E10 and E11 and the lower electrodes E20 and E21 are highly elastic and highly flexible, the upper electrodes E10 and E11 and the lower electrodes E20 and E21 may flexibly deform according to deformation of the device even without having a buckled structure.

The flexible semiconductor devices according to exemplary embodiments described with reference to FIGS. 1 through 4 may be optoelectronic devices. The vertical semiconductor elements S10 and S11 may be light-emitting elements or a photovoltaic elements. When the vertical semiconductor elements S10 and S11 are light-emitting elements, a semiconductor device including the same may be a light-emitting device. When the vertical semiconductor elements S10 and S11 are photovoltaic elements, a semiconductor device including the same may be a photovoltaic device. Materials of the vertical semiconductor elements S10 and S11 for when the flexible semiconductor device is a light-emitting device, and materials of the vertical semiconductor elements S10 and S11 for when the flexible semiconductor device is a photovoltaic device are obvious to one of ordinary skill in the art, and thus, description thereof is omitted.

FIGS. 5A through 5J are cross-sectional views illustrating a method of manufacturing a flexible semiconductor device, according to an exemplary embodiment.

Figure 5A:
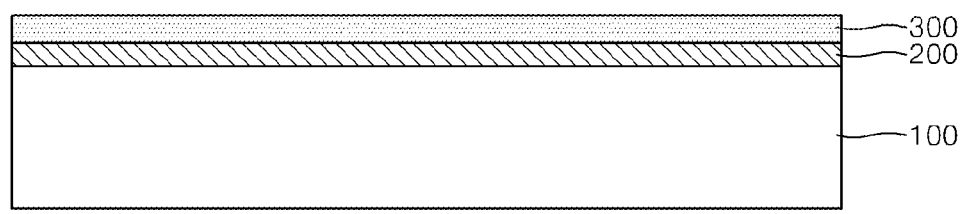
FIGS. 5A through 5J are cross-sectional views illustrating a method of manufacturing a flexible semiconductor device, according to an exemplary embodiment.

Referring to FIG. 5A, an underlayer 200 may be formed on a substrate 100. The substrate 100 may be an amorphous substrate. For example, the substrate 100 may be a glass substrate. However, the material of the substrate 100 is not limited to glass and may be of various materials. The underlayer 200 may have a first coefficient of thermal expansion (CTE). The first CTE of the underlayer 200 and a second CTE of a buffer layer 300, which is formed on the underlayer 200, may vary by a relatively great degree. The underlayer 200 may be a metal layer. For example, the underlayer 200 may include at least one of Ti, Hf, Zr, and Al. If the underlayer 200 is formed of Ti, the first CTE of the underlayer 200 may be about $8.6 \times 10^{-6}$/K. The underlayer 200 may have a hexagonal close packed (HCP) crystal structure or a face centered cubic (FCC) crystal structure. The underlayer 200 may have a preferred orientation in a direction perpendicular to a surface of the underlayer 200 (i.e., a c-axis direction). The underlayer 200 may be a material layer which has a small degree of lattice mismatch with a vertical semiconductor element 500 (FIG. 5C) which is to be formed later. For example, a lattice mismatch between the underlayer 200 and the vertical semiconductor element 500 (FIG. 5C) may be about 20% or less.

The buffer layer 300 may be formed on the underlayer 200. The buffer layer 300 may be formed of a Group III-V based compound semiconductor. For example, the buffer layer 300 may be formed of a GaN-based semiconductor. In detail, for example, the buffer layer 300 may be formed to include at least one of GaN, AlN, InGaN, AlGaN, and AlInGaN. For example, the buffer layer 300 may be formed to include a GaN-based semiconductor or an AlN-based semiconductor. The buffer layer 300 may be a single layer or a multi-layer such as a double layer or a triple layer formed of the above materials. The buffer layer 300 may be formed at a low temperature of about 450° C. to about 650° C. When forming the buffer layer 300 using GaN at a low temperature as described above, the buffer layer 300 may be referred to as an LT-GaN layer. When forming the buffer layer 300 using AlN at such a low temperature, the buffer layer 300 may be referred to as an LT-AlN layer. The buffer layer 300 may have a preferred orientation in a direction perpendicular to a surface of the underlayer 200 (i.e., a c-axis direction) due to the preferred orientation of the underlayer 200 formed under the buffer layer 300.

The buffer layer 300 may have a second CTE. As described above, a difference between the second CTE of the buffer layer 300 and the first CTE of the underlayer 200 may be relatively great. For example, a difference between the first CTE of the underlayer 200 and the second CTE of the buffer layer 300 may be about 1.5 times or more. The first CTE of the underlayer 200 may be greater than the second CTE of the buffer layer 300 by about 1.5 times or more. When the buffer layer 300 is a GaN layer, a CTE of the buffer layer 300 in a direction perpendicular to a c-axis may be about $3.1 \times 10^{-6}$ to about $3.7 \times 10^{-6}$/K, and a CTE of the buffer layer 300 in the c-axis direction may be about $2.8 \times 10^{-6}$ to about $5.6 \times 10^{-6}$/K. By using the underlayer 200 and the buffer layer 300 which differ greatly in CTEs, a thermal stress may be induced (generated) between the underlayer 200 and the buffer layer 300 using a predetermined method described below, and an interfacial adhesion between the underlayer 200 and the buffer layer 300 may be weakened (degraded) so that the underlayer 200 and the buffer layer 300 may be separated.

Figure 5B:
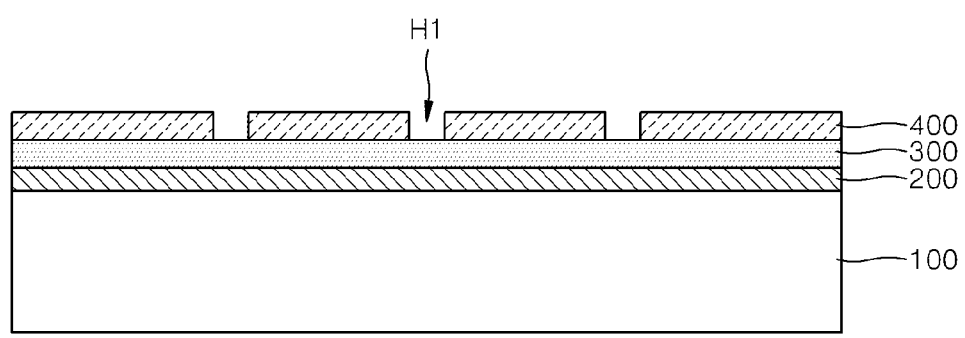

Referring to FIG. 5B, a mask layer 400 may be formed on the buffer layer 300. The mask layer 400 may include at least one opening region H1 that exposes the buffer layer 300. The opening region H1 may have a hole shape. A diameter of the opening region H1 may be, for example, several nm to several μm. The mask layer 400 may be formed of silicon oxide or silicon nitride, or a mixture of silicon oxide and silicon nitride. The mask layer 400 may have a single-layer structure or a multi-layer structure. A thickness of the mask layer 400 may be about 10 nm to 500 nm, for example, about 10 nm to 200 nm.

Figure 5C:
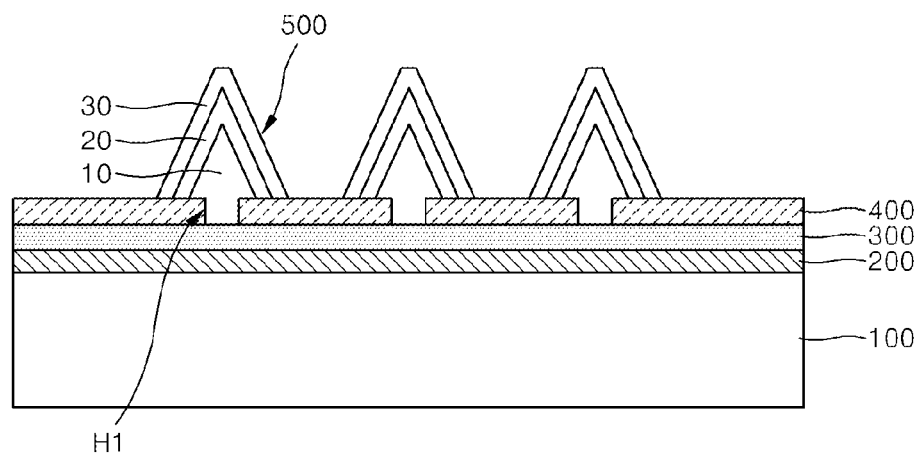

Referring to FIG. 5C, the vertical semiconductor element 500 may be grown on a portion of the buffer layer 300 that is exposed by the opening region H1. The vertical semiconductor element 500 may have a pyramid shape or a similar shape thereto. Alternatively, the vertical semiconductor element 500 may be rod-shaped or have a similar shape thereto. The shape of the vertical semiconductor element 500 is not limited to a pyramid shape or a rod shape and may be any various shapes. The vertical semiconductor element 500 may have a core-shell structure. For example, the vertical semiconductor element 500 may include a first conductivity type semiconductor 10 and a second conductivity type semiconductor 30 surrounding the first conductivity type semiconductor 10. The first conductivity type semiconductor 10 may be referred to as a core portion, and the second conductivity type semiconductor 30 may be referred to as a shell portion. The vertical semiconductor element 500 may further include an active layer 20 included between the first conductivity type semiconductor 10 and the second conductivity type semiconductor 30. The active layer 20 may surround the first conductivity type semiconductor 10. The vertical semiconductor element 500 may include a Group III-V based compound semiconductor. The vertical semiconductor element 500 may include a GaN-based semiconductor, for example, at least one of GaN, InGaN, AlGaN, and AlInGaN. In detail, for example, the first conductivity type semiconductor 10 may include n-type GaN, and the second conductivity type semiconductor 30 may include p-type GaN. Alternatively, the first conductivity type semiconductor 10 may include p-type GaN, and the second conductivity type semiconductor 30 may include n-type GaN. The active layer 20 may have a stacked structure in which a quantum well layer and a barrier layer are alternately stacked at least once. The active layer 20 may have a single quantum well (SQW) structure or a multi-quantum well (MQW) structure. In detail, for example, the active layer 20 may have an MQW structure in which an InGaN layer (quantum well layer) and a GaN layer (barrier layer) are alternately and repeatedly stacked. However, this is exemplary, and the structure of the active layer 20 may vary. Also, although not shown in the drawings, the vertical semiconductor element 500 may further include a predetermined superlattice structure layer. The superlattice structure layer is well-known in the art, and thus, description thereof is omitted. According to circumstance, the active layer 20 may not necessarily be formed. When not forming the active layer 20, the vertical semiconductor element 500 may be regarded as having a PN structure.

At least a portion of the vertical semiconductor element 500 may be formed at a relatively high temperature of, for example, about 900° C. to about 1100° C. When forming a portion of the vertical semiconductor element 500 at such a high temperature range using GaN, the GaN may be referred to as high temperature (HT)-GaN. At least a portion of the vertical semiconductor element 500 may include HT-GaN or a material based on HT-GaN. The first conductivity semiconductor L10 and the second conductivity type semiconductor L30 of the vertical semiconductor element 500 may be formed at a relatively high temperature of, for example, about 900° C. to about 1100° C. The temperature at which the active layer 20 is formed may be relatively lower than the temperature at which the first and second conductivity type semiconductors 10 and 30 are formed. For example, when the active layer 20 is formed to have an MQW structure in which an InGaN layer (quantum well layer) and a GaN layer (barrier layer) are alternately and repeatedly stacked, the InGaN layer (quantum well layer) may be formed at a temperature of about 600° C. to about 850° C., and the GaN layer (barrier layer)

may be formed at a temperature of about 700° C. to about 900° C. As such, when the active layer 20 is formed at a relatively low temperature (e.g., 600-900° C.), the active layer 20 may be formed to cover an upper surface of the mask layer 400. In this case, the second conductivity type semiconductor 30 may be formed on the entire surface of the active layer 20 which covers the upper surface of the mask layer 400. In other words, the active layer 20 and the second conductivity type semiconductor 30 may be formed to cover the entire surface of the mask layer 400. The vertical semiconductor element 500 may have a preferred orientation in a c-axis direction due to the buffer layer 300 formed under the vertical semiconductor element 500. The vertical semiconductor element 500 may have excellent crystallinity.

Figure 5D:
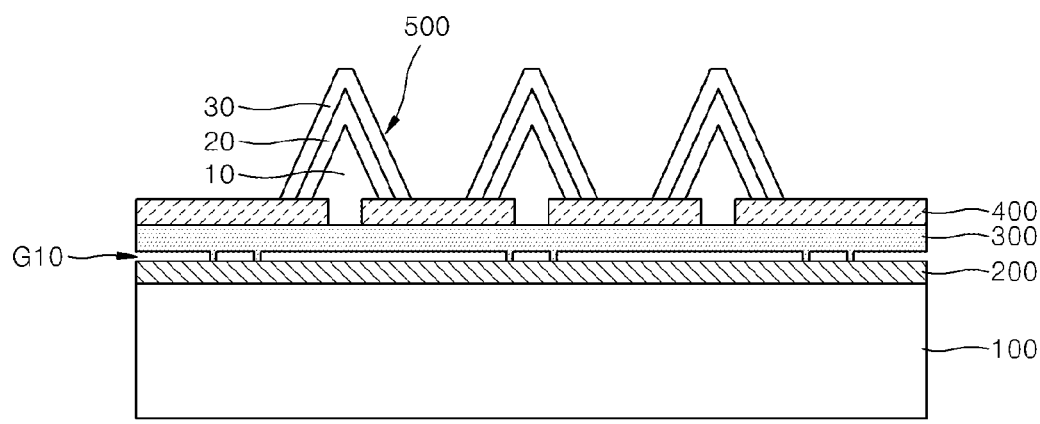

Referring to FIG. 5D, an adhesive force between the underlayer 200 and the buffer layer 300 may be weakened (degraded) using a predetermined method. When the underlayer 200 and the buffer layer 300 are heated to a predetermined temperature or higher and then cooled under a predetermined condition, the adhesive force between the underlayer 200 and the buffer layer 300 may be weakened (degraded). In more detail, for example, while the underlayer 200 and the buffer layer 300 are heated to about 700° C. or to about 900° C. or higher, and then they are cooled at a rate of about 5° C./min to about 30° C./min or about 10° C./min to about 30° C./min, stress due to the difference in CTEs of the underlayer 200 and the buffer layer 300 becomes greater than an interfacial adhesion so as to separate the underlayer 200 and the buffer layer 300. As a result, a gap G10 may be formed between the underlayer 200 and the buffer layer 300. The underlayer 200 and the buffer layer 300 may be not completely separated but partially (incompletely) separated. If the cooling speed is too slow, thermal stress is hardly generated between the underlayer 200 and the buffer layer 300, and the gap G10 may not be formed. Accordingly, the cooling speed of the underlayer 200 and the buffer layer 300 may be fast as about 5° C./min or higher or about 10° C./min or higher. That is, after heating the underlayer 200 and the buffer layer 300 to a predetermined temperature or higher, by cooling them at a relatively fast speed, thermal stress due to a difference in CTEs increases, and accordingly, adhesive force between the underlayer 200 and the buffer layer 300 may be weakened (degraded) significantly. Accordingly, an appropriate condition for physically separating the underlayer 200 and the buffer layer 300 may be achieved.

When the mask layer 400 has an appropriate CTE and an appropriate thickness, the mask layer 400 may influence interfacial stress between the underlayer 200 and the buffer layer 300, which may further facilitate separation (partial separation) between the underlayer 200 and the buffer layer 300. If the mask layer 400 is formed of silicon oxide ($SiO_2$), and a thickness of the mask layer 400 is about 200 nm or less, the underlayer 200 and the buffer layer 300 may be easily separated (partial separation) due to the mask layer 400. Here, the CTE of the silicon oxide ($SiO_2$) may be about $0.5 \times 10^{-6}$/K. Accordingly, when the mask layer 400 is formed of silicon oxide ($SiO_2$), the mask layer 400 may preferably be formed to have a thickness of about 200 nm or less. However, when the material of the mask layer 400 varies, an appropriate thickness range of the mask layer 400 may also vary. According to circumstance, when adhesive force between the underlayer 200 and the buffer layer 300 is weakened (degraded), adhesive force between the buffer layer 300 and the mask layer 400 may also be weakened (degraded).

If the active layer 20 and the second conductivity type semiconductor 30 are formed to cover the entire upper surface of the mask layer 400, the active layer 20 and the second conductivity type semiconductor 30 may also influence interfacial stress between the underlayer 200 and the buffer layer 300, and separation (partial separation) between the underlayer 200 and the buffer layer 300 may be facilitated. In this respect, the active layer 20 and the second conductivity type semiconductor 30 may preferably be formed to cover the entire upper surface of the mask layer 400.

Figure 5E:
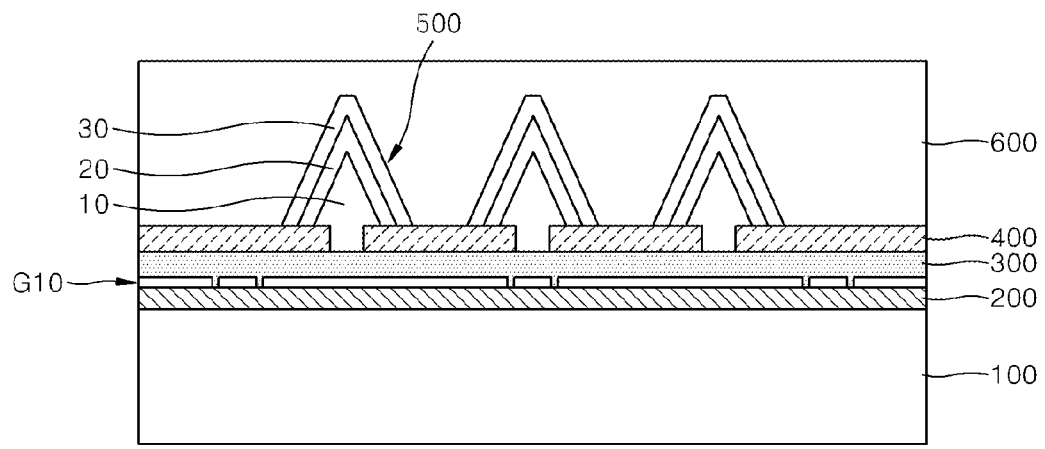

Referring to FIG. 5E, a flexible material layer 600 may be formed on the substrate 100. The flexible material layer 600 may include an elastomer. The elastomer may be an elastic polymer. In detail, for example, the elastomer may include at least one of PDMS, polyurethane, polyester, and a mixture thereof. The flexible material layer 600 may be formed by spin-coating a polymer solution having a predetermined viscosity and then hardening the same. The flexible material layer 600 may be formed to cover the vertical semiconductor elements 500 and to fill spaces between the vertical semiconductor elements 500. Accordingly, the vertical semiconductor element 500 may be embedded in the flexible material layer 600. Also, the flexible material layer 600 may be formed to fill at least a portion of the gap G10 between the underlayer 200 and the buffer layer 300. The flexible material layer 600 may be transparent.

Figure 5F:
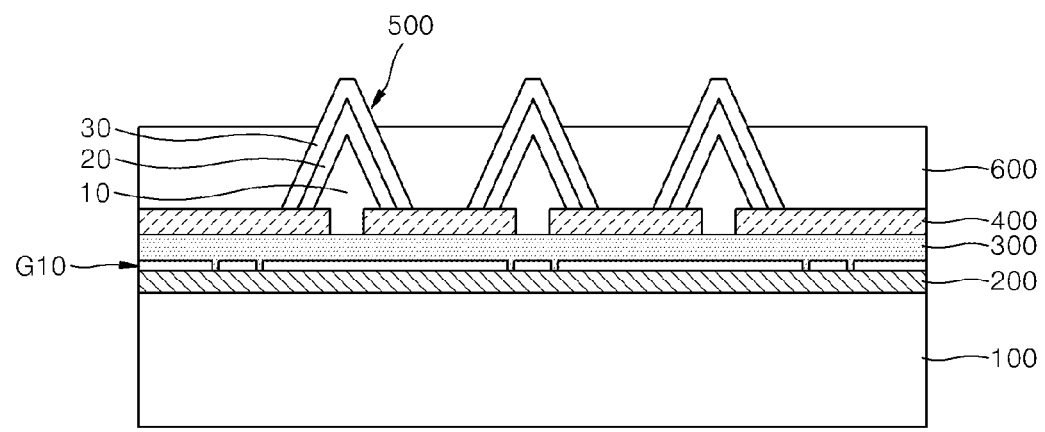
Figure 9:
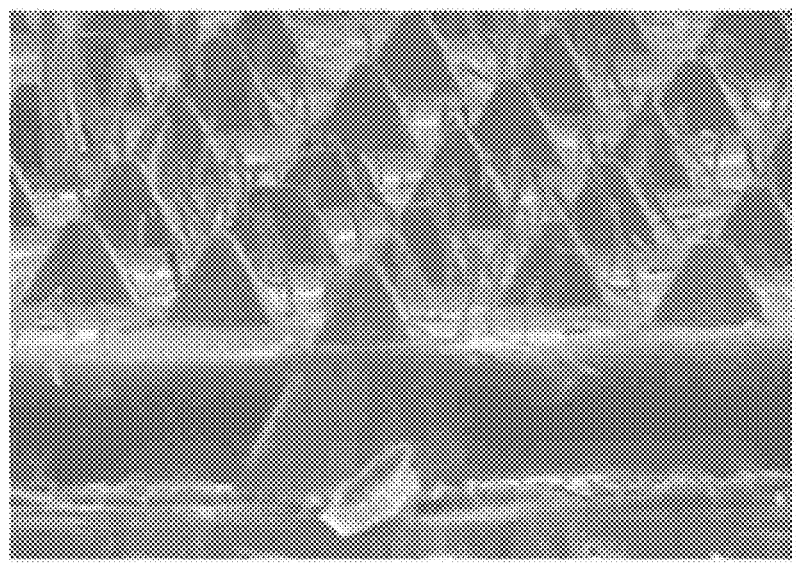
FIG. 9 is a scanning electron microscope (SEM) image of a structure corresponding to an operation described with reference to FIG. 5F.

Referring to FIG. 5F, a portion of the flexible material layer 600 may be etched to expose a portion of the vertical semiconductor element 500. To etch the flexible material layer 600, for example, an etching gas containing $CF_4$ and $O_2$ may be used. Through this process, a portion of the vertical semiconductor element 500 may protrude out of the flexible material layer 600. A portion of an upper portion of the vertical semiconductor element 500 may protrude out of an upper surface of the flexible material layer 600. About a fifth (⅕) to a half (½) of the vertical semiconductor element 500 may protrude out of the flexible material layer 600. A resultant product obtained by etching a portion of the flexible material layer 600 and exposing a portion of the vertical semiconductor element 500 illustrated in FIG. 5F may be as shown in FIG. 9. FIG. 9 is a scanning electron microscope (SEM) image of a structure corresponding to an operation described with reference to FIG. 5F. Referring to FIG. 9, a plurality of vertical semiconductor elements having a pyramid structure are regularly arranged, and upper portions of the vertical semiconductor elements are exposed above the flexible material layer 600.

Figure 5G:
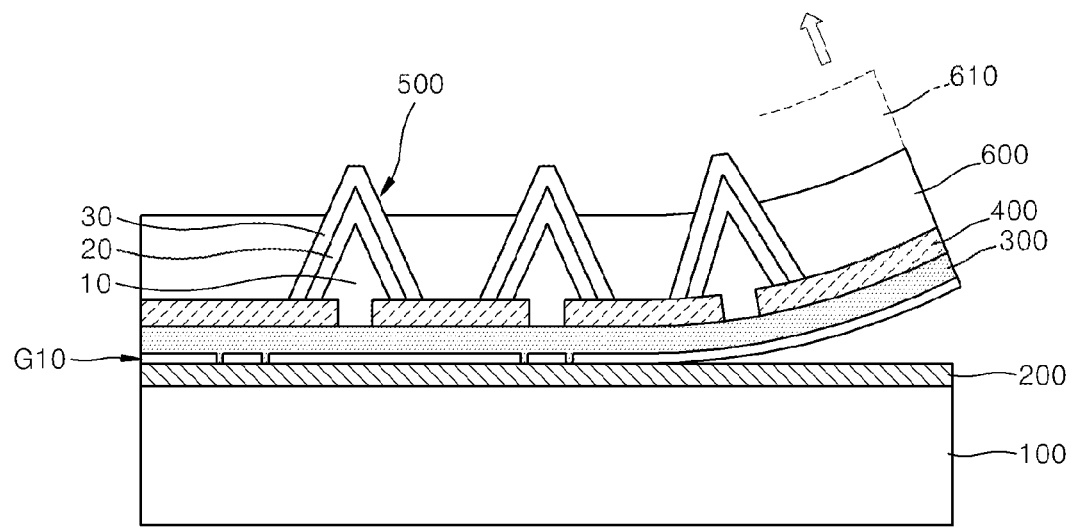

Referring to FIG. 5G, the flexible material layer 600 in which the vertical semiconductor element 500 is embedded may be separated from the underlayer 200 together with the buffer layer 300. As the buffer layer 300 and the underlayer 200 are separated partially (or mostly), the gap G10 therebetween is filled by the flexible material layer 600, and an adhesive force between the flexible material layer 600 and the underlayer 200 is relatively weak, the flexible material layer 600 may be easily separated from the underlayer 200. Here, when necessary, a predetermined supporting film 610 may be attached on the flexible material layer 600, and then the flexible material layer 600 may be separated using the supporting film 610. The supporting film 610 may be a flexible film. For example, the supporting film 610 may be an adhesive film (or adhesive tape). After attaching the supporting film 610 on a portion of the flexible material layer 600 (for example, on an end portion), and then pulling the flexible material layer 600 by using the supporting film 610, the flexible material layer 600 may be separated from the underlayer 200. As described above, when using the supporting film 610, a separation process may be easy.

Figure 5H:
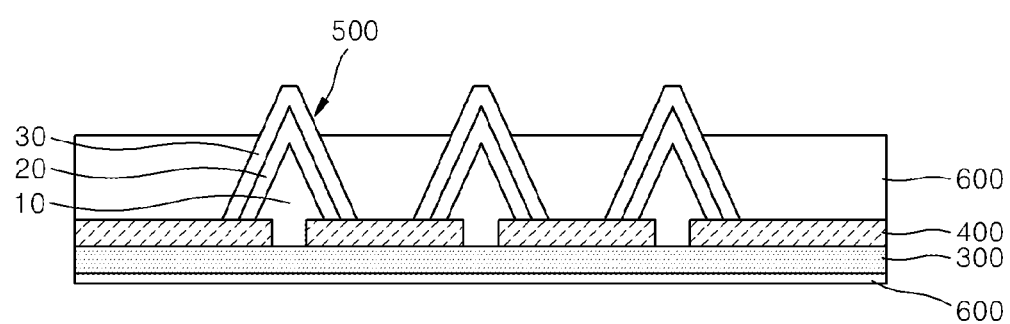
Figure 5I:
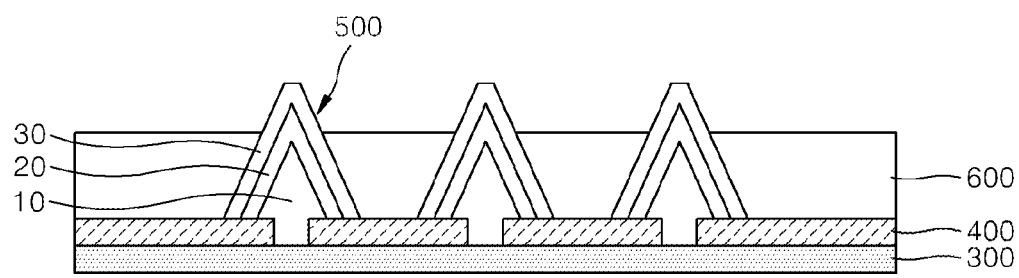

A resultant product obtained by separating the flexible material layer 600 from the underlayer 200 using the operation illustrated in FIG. 5G is illustrated in FIG. 5H. Referring to FIG. 5H, a portion of the flexible material layer 600 may remain on a lower surface of the buffer layer 300. By removing the flexible material layer 600 remaining on the lower surface of the buffer layer 300, a lower surface of the buffer layer 300 may be exposed. A resultant product thereof is illustrated in FIG. 5I. The flexible material layer 600 remaining on the lower surface of the buffer layer 300 may be removed after the flexible material layer 600, in which the vertical semiconductor element 500 is embedded, is upside down.

Figure 5J:
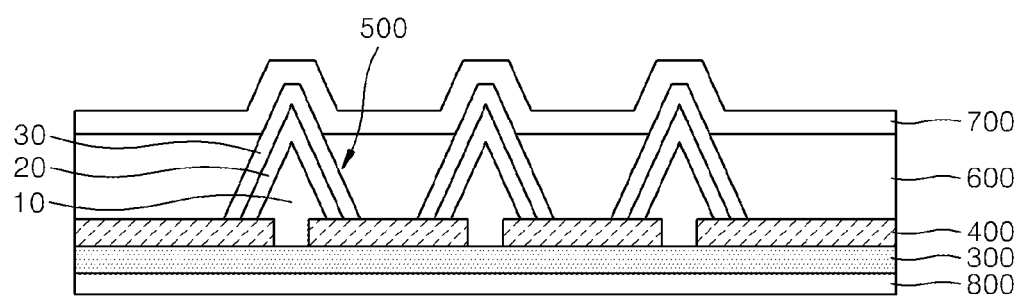

Referring to FIG. 5J, an upper electrode 700 that is electrically connected to the vertical semiconductor element 500 may be formed on an upper surface of the flexible material layer 600. A lower electrode 800 that is electrically connected to the vertical semiconductor element 500 may be formed on a lower surface of the flexible material layer 600. The lower electrode 800 may be formed on a lower surface of the buffer layer 300. The lower electrode 800 may be electrically connected to the vertical semiconductor element 500 via the buffer layer 300. At least one of the upper electrode 700 and the lower electrode 800 may be a transparent electrode. Both the upper electrode 700 and the lower electrode 800 may be transparent electrodes. The transparent electrode may be formed of, for example, graphene, or a transparent conductive oxide (TCO) such as indium tin oxide (ITO). One of the upper electrode 700 and the lower electrode 800 may be a transparent electrode, and the other may be an opaque electrode. The opaque electrode may be formed of, for example, Au, Pd, Al, Pt, Ag, Ti, and a mixture thereof. However, the materials of the upper electrode 700 and the lower electrode 800 are not limited thereto, but may vary. Also, at least one of the upper electrode 700 and the lower electrode 800 may be formed to have a buckled structure, as described with reference to FIG. 4.

FIGS. 6A through 6I are cross-sectional views illustrating a method of manufacturing a flexible semiconductor device, according to another exemplary embodiment.

Figure 6A:
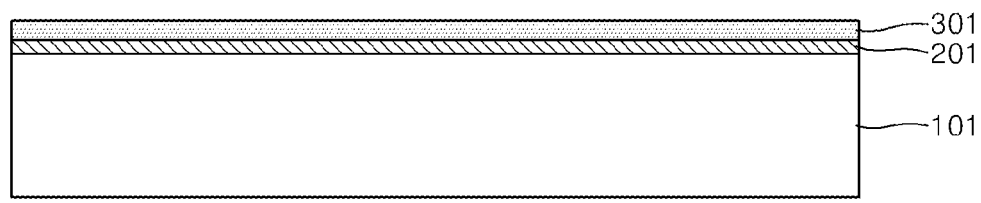
FIGS. 6A through 6I are cross-sectional views illustrating a method of manufacturing a flexible semiconductor device, according to another exemplary embodiment.

Referring to FIG. 6A, an underlayer 201 may be formed on a substrate 101, and a buffer layer 301 may be formed on the underlayer 201. Materials of the substrate 101, the underlayer 201, and the buffer layer 301 are substantially the same as or similar to those of the substrate 100, the underlayer 200, and the buffer layer 300 of FIG. 5A, respectively. A stacked structure of the underlayer 201 and the buffer layer 301 may be referred to as a "stacked layer."

Figure 6B:
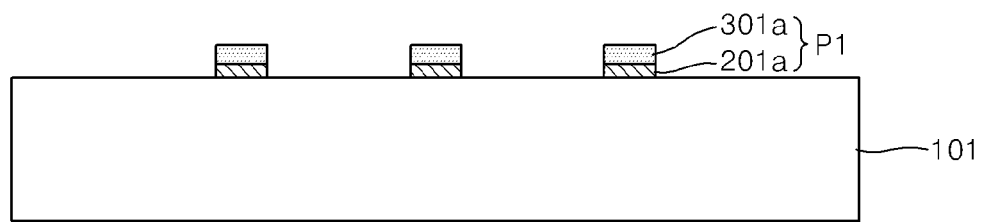

Referring to FIG. 6B, at least one stack pattern P1 may be formed by patterning the buffer layer 301 and the underlayer 201. A plurality of stack patterns P1 that are spaced apart from one another at predetermined intervals may be formed. The patterned underlayer 201 and the patterned buffer layer 301 are denoted with reference numerals 201a and 301a, respectively. An operation of forming the stack patterns P1 may be regarded as an operation for defining an unit region for forming a vertical semiconductor element 501 (FIG. 6C) later.

Figure 6C:
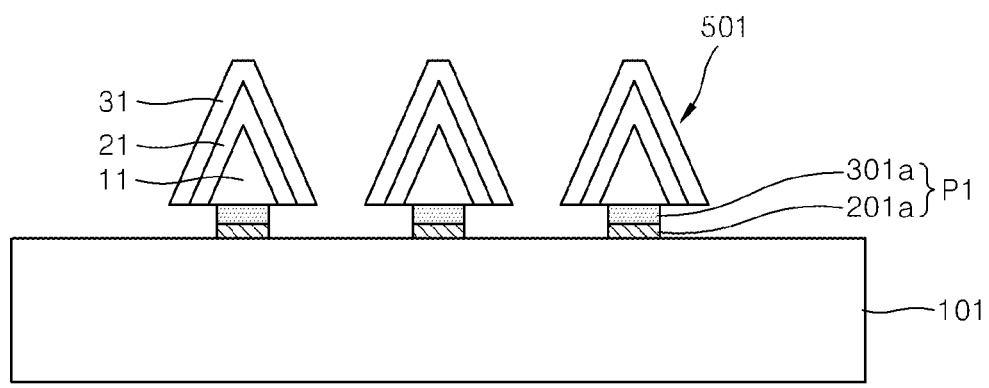

Referring to FIG. 6C, vertical semiconductor elements 501 may be grown on the stack patterns P1, respectively. The vertical semiconductor element 501 may include a first conductivity type semiconductor 11, a second conductivity type semiconductor 31, and an active layer 21 included therebetween. According to circumstance, the active layer 21 may not be formed. The vertical semiconductor element 501 may have similar materials and a similar structure as those of the vertical semiconductor element 500 and be formed using similar methods, and thus, description thereof is not repeated.

Figure 6D:
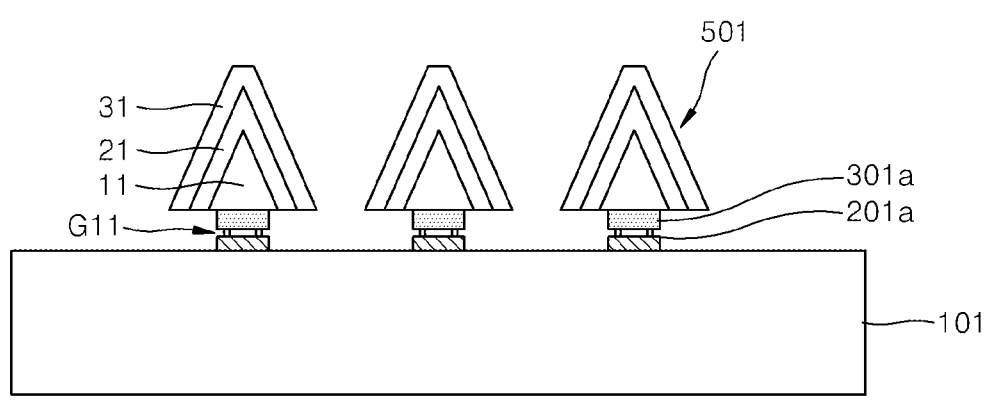

Referring to FIG. 6D, an adhesive force between the underlayer 201a and the buffer layer 301a may be weakened (degraded) using a predetermined method. When the underlayer 201a and the buffer layer 301a are heated to a predetermined temperature or higher and then cooled under a predetermined condition, the adhesive force between the underlayer 201a and the buffer layer 301a may be weakened (degraded). In more detail, for example, while the underlayer 201a and the buffer layer 301a are heated to about 700° C. or to about 900° C. or higher, when they are cooled at a rate of about 5° C./min to about 30° C./min or about 10° C./min to about 30° C./min, stress due to the difference in CTEs of the underlayer 201a and the buffer layer 301a becomes greater than an interfacial adhesion so that the underlayer 201a and the buffer layer 301a may be separated. As a result, a gap G11 may be formed between the underlayer 201a and the buffer layer 301a. This may be similar to an operation described with reference to FIG. 5D for weakening (degrading) the adhesive force between the underlayer 200 and the buffer layer 300.

Figure 6E:
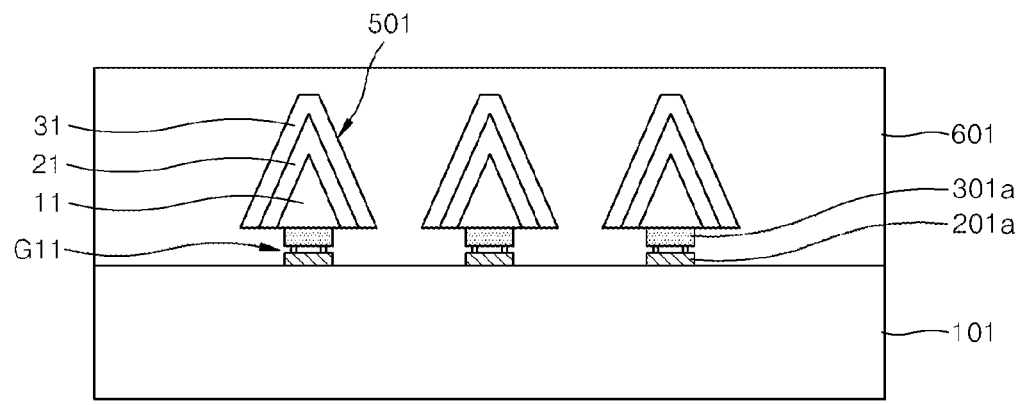

Referring to FIG. 6E, a flexible material layer 601 may be formed on the substrate 101. The flexible material layer 601 may be formed to cover the vertical semiconductor element 501 and to fill spaces therebetween. Accordingly, the vertical semiconductor element 501 may be embedded in the flexible material layer 601. Also, the flexible material layer 601 may be formed to at least partially fill the gap G11 between the underlayer 201a and the buffer layer 301a. In other words, the flexible material layer 601 may be formed to fill at least a portion of the gap G11. The materials of the flexible material layer 601 may be substantially the same as or similar to those of the flexible material layer 600 of FIG. 5E.

Figure 6F:
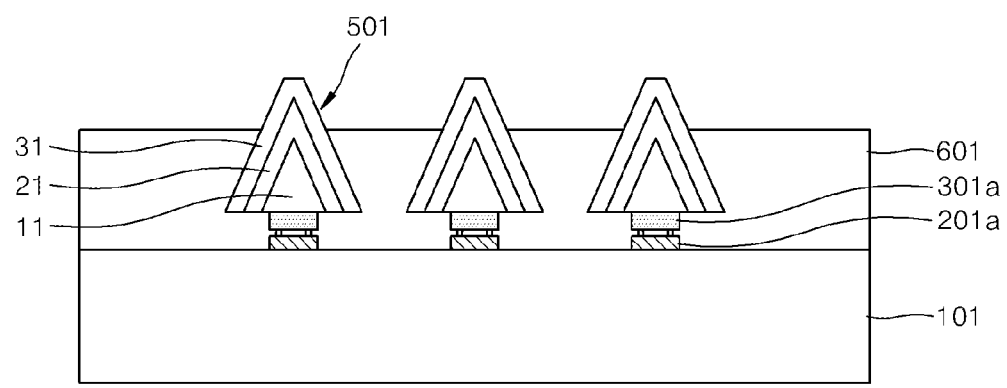

Referring to FIG. 6F, a portion of the vertical semiconductor element 501 may be exposed by etching a portion of the flexible material layer 601. A method of etching a portion of the flexible material layer 601 may be the same or similar as the method described with reference to FIG. 5F.

Figure 6G:
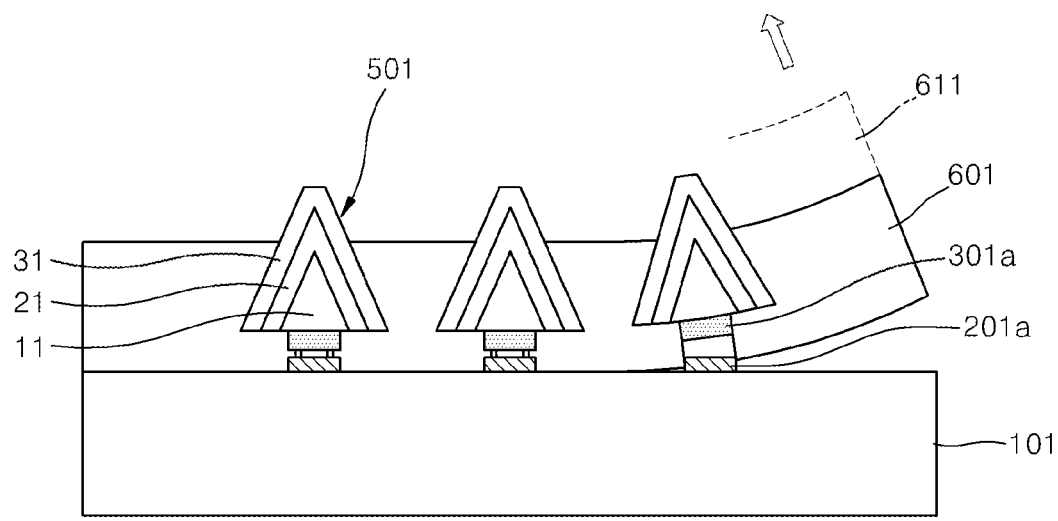

Referring to FIG. 6G, the flexible material layer 601 in which the vertical semiconductor element 501 is embedded may be separated from the substrate 101 and the underlayer 201a, together with the buffer layer 301a. The buffer layer 301a and the underlayer 201a are separated partially (or mostly), and an adhesive force between the flexible material layer 601 and the substrate 101 and an adhesive force between the flexible material layer 601 and the underlayer 201a are relatively weak, and thus the flexible material layer 601 may be easily separated from the substrate 101 and the underlayer 201a. Here, when necessary, a predetermined supporting film 611 may be attached on the flexible material layer 601, and then the flexible material layer 601 may be detached by using the supporting film 611. The supporting film 611 may be the same or similar as the supporting film 610 of FIG. 5G.

Figure 6H:
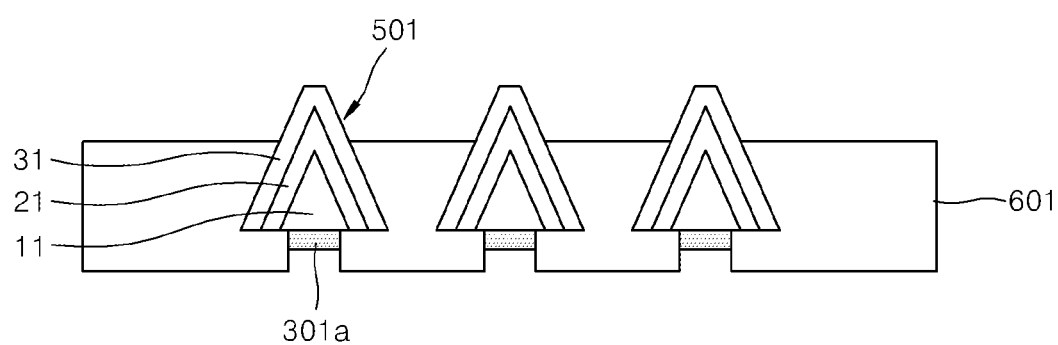

A resultant product obtained by separating the flexible material layer 601 from the underlayer 201a as in the operation described with reference to FIG. 6G is illustrated in FIG. 6H. While not shown in FIG. 6H, a portion of the flexible material layer 601 may remain on a lower surface of the underlayer 201a, and in this case, an operation for removing the same may be further performed. Also, a lower surface portion of the flexible material layer 601 may be etched in the operation illustrated in FIG. 6H. That is, by etching a portion of the flexible material layer 601 around the buffer layer 301a, a lower surface of the flexible material layer 601 may be planarized. Consequently, a lower level of the flexible material layer 601 and a lower level of the buffer layer 301a may be adjusted to be about the same.

Figure 6I:
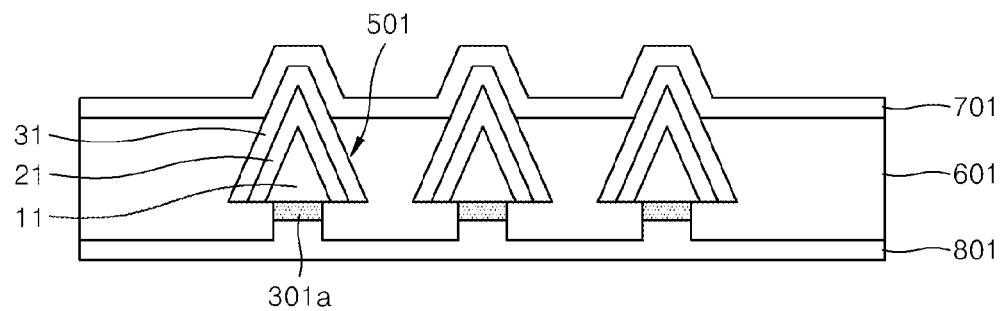

Referring to FIG. 6I, an upper electrode 701 that is electrically connected to the vertical semiconductor element 501 may be formed on an upper surface of the flexible material layer 601. A lower electrode 801 that is electrically connected to the vertical semiconductor element 501 may be formed on a lower surface of the flexible material layer 601. Structures of the upper electrode 701 and the lower electrode 801 in detail may be substantially the same as or similar to those of the upper electrode 700 and the lower electrode 800 of FIG. 5J, respectively.

FIGS. 7A through 7F are cross-sectional views illustrating a method of manufacturing a flexible semiconductor device, according to another exemplary embodiment.

Figure 7A:
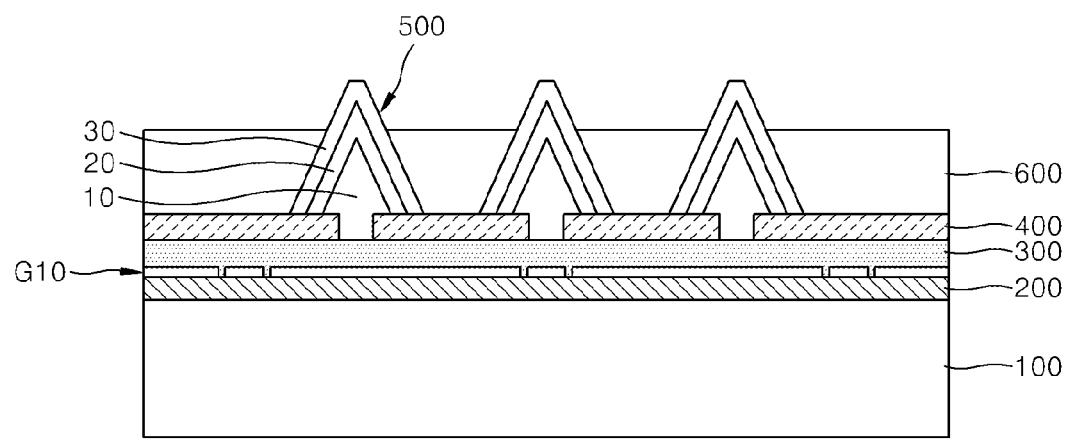
FIGS. 7A through 7F are cross-sectional views illustrating a method of manufacturing a flexible semiconductor device, according to another exemplary embodiment.

Referring to FIG. 7A, a structure as illustrated in FIG. 5F may be provided. That is, after forming an underlayer 200 and a buffer layer 300 or the like on a substrate 100, at least one vertical semiconductor element 500 may be formed thereon, and then an adhesive force between the underlayer 200 and the buffer layer 300 may be weakened (degraded) to form a gap G10 therebetween. Next, a flexible material layer 600 that covers at least a portion of the vertical semiconductor element 500 may be formed. The vertical semiconductor element 500 may be embedded in the flexible material layer 600.

Figure 7B:
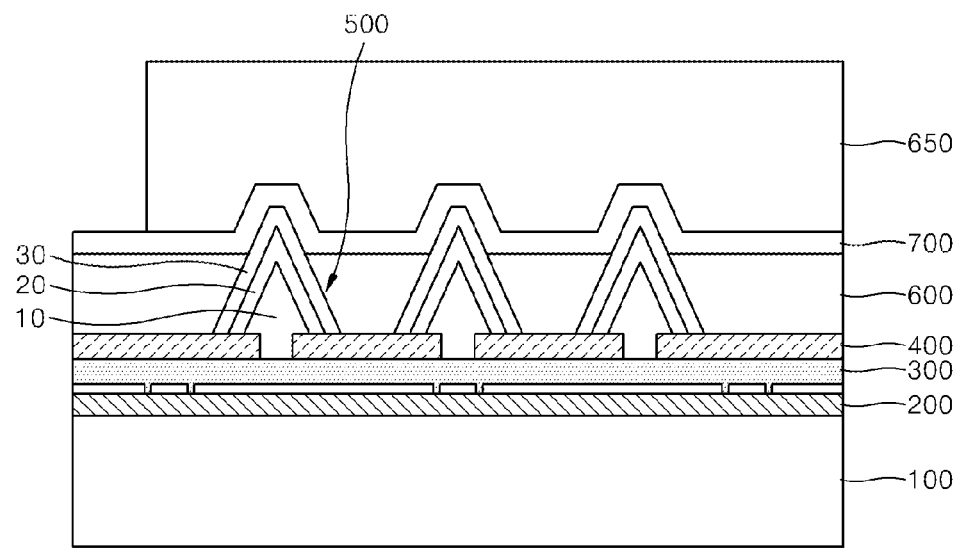

Referring to FIG. 7B, an upper electrode 700 covering an exposed portion of the vertical semiconductor element 500 may be formed on the flexible material layer 600. Materials of the upper electrode 700 may be the same as those of the upper electrode E10 described with reference to FIG. 1. Next, a supporting film 650 may be formed on the upper electrode 700. The supporting film 650 may include an elastomer. The elastomer may be an elastic polymer. For example, the elastomer may include at least one of PDMS, polyurethane, polyester, and a mixture thereof. The supporting film 650 may be flexible like the flexible material layer 600. In this respect, the supporting film 650 may be referred to as a second flexible material layer. The supporting film 650 may be thicker than the flexible material layer 600. The upper electrode 700 and the vertical semiconductor element 500 may be protected by the supporting film 650. A portion of the upper electrode 700 may be not covered by the supporting film 650 but exposed. A portion of the upper electrode 700 that is not covered by the supporting film 650 but is exposed may be a "contact area."

Figure 7C:
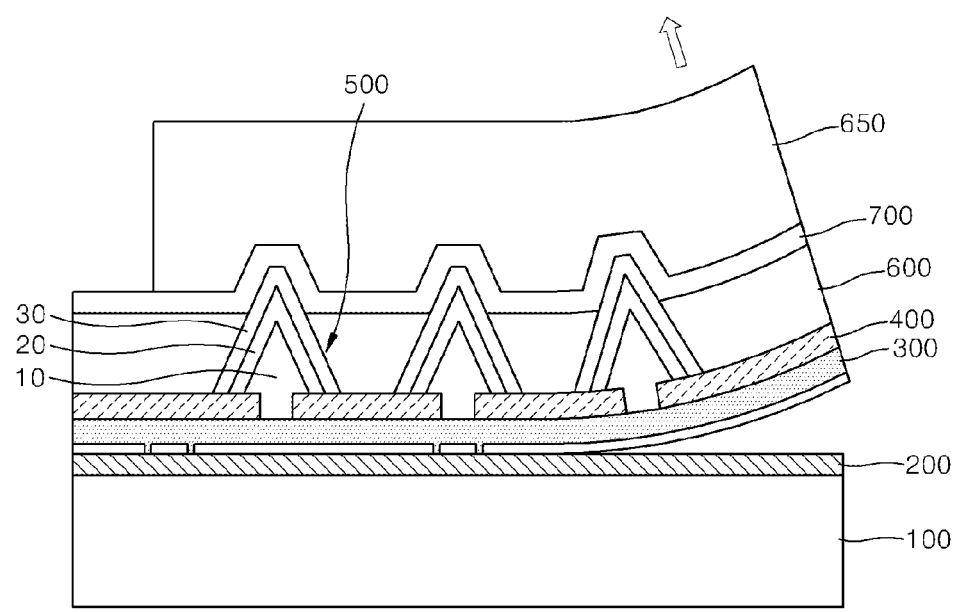

Referring to FIG. 7C, the flexible material layer 600 to which the supporting film 650 is attached may be separated from the substrate 100. Here, the underlayer 200 and the buffer layer 300 may be separated. Separation between the underlayer 200 and the buffer layer 300 is similar as described with reference to FIG. 5G, and thus description thereof is not repeated. When separating the flexible material layer 600 while the supporting film 650 is attached, a separation operation may be easy.

Figure 7D:
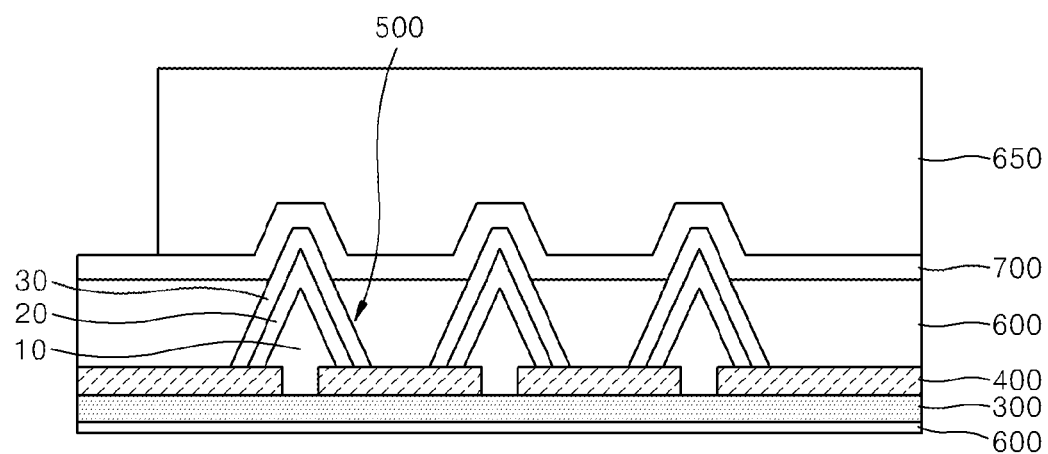
Figure 7E:
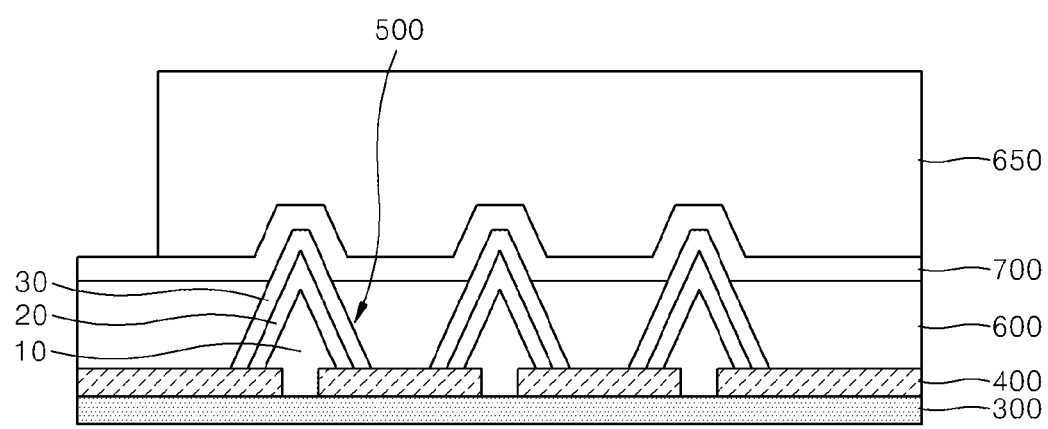

A resultant product obtained by separating the flexible material layer 600 and the supporting film 650 in the operation described with reference to FIG. 7C from the underlayer 200 is illustrated in FIG. 7D. Referring to FIG. 7D, a portion of the flexible material layer 600 may remain on a lower surface of the buffer layer 300. By removing the remaining portion of the flexible material layer 600 on the lower surface of the buffer layer 300, a lower surface of the buffer layer 300 may be exposed. A resultant product thereof is illustrated in FIG. 7E.

Figure 7F:
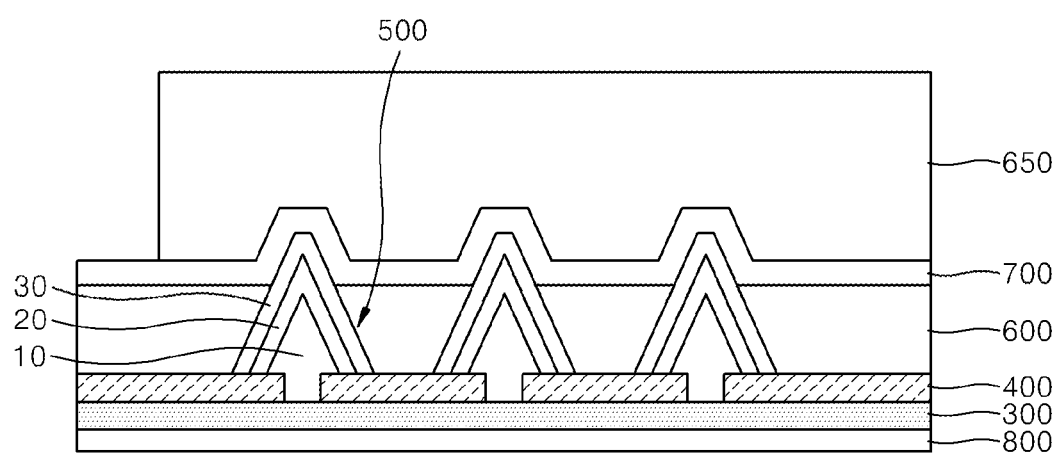

Referring to FIG. 7F, a lower electrode 800 electrically connected to the vertical semiconductor element 500 may be formed on a lower surface of the flexible material layer 600. The lower electrode 800 may be formed on a lower surface of the buffer layer 300. The lower electrode 800 may be electrically connected to the vertical semiconductor element 500 via the buffer layer 300. Materials of the lower electrode 800 may be the same as those of the lower electrode E20 described with reference to FIG. 1. As illustrated in FIG. 7F, when the supporting film 650 is formed on the upper electrode 700, a flexible semiconductor device may have a more stable structure.

A method of detaching the flexible material layer 600 from the substrate 100 while forming the upper electrode 700 and the supporting film 650 on the flexible material layer 600 using the method described with reference to FIGS. 7A through 7F may also be similarly applied to the structure of FIG. 6F.

Figure 8A:
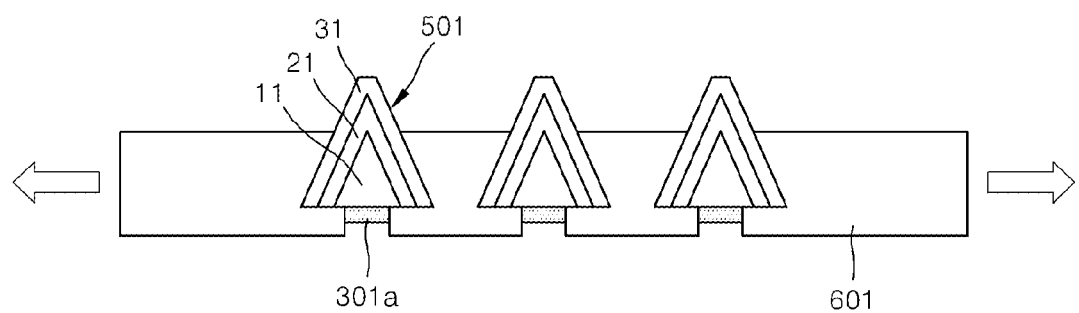
FIGS. 8A and 8B are cross-sectional views illustrating a method of manufacturing a flexible semiconductor device, according to another exemplary embodiment.
Figure 8B:
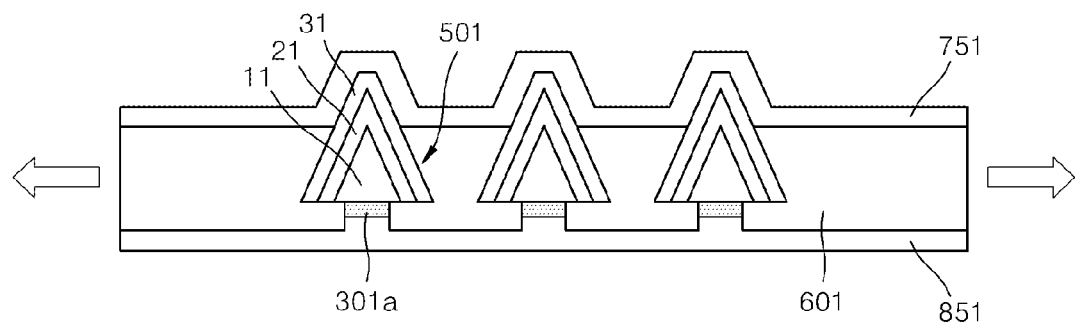

FIGS. 8A and 8B are cross-sectional views illustrating a method of manufacturing a flexible semiconductor device, according to another exemplary embodiment.

Referring to FIG. 8A, after forming the structure of FIG. 6H, a length of the flexible material layer 601 may be extended by pulling at least two ends of the flexible material layer 601. That is, the flexible material layer 601 may be extended. As the flexible material layer 601 has excellent elasticity, an extension process may be easily performed. As the length of the flexible material layer 601 is extended, intervals between the plurality of the vertical semiconductor elements 501 may be increased.

Referring to FIG. 8B, while keeping the flexible material layer 601 in an extended state, an upper electrode 751 and a lower electrode 851 may be formed. After forming the upper electrode 751 and the lower electrode 851, when a force for extending the flexible material layer 601 is removed, the flexible material layer 601 contracts and a corrugated structure (e.g., buckled structure) may be formed in the upper electrode 751 and the lower electrode 851 or a similar effect may be generated. Accordingly, if the flexible material layer 601 is bent or extended, the upper electrode 751 and the lower electrode 851 may react more flexibly.

The method described with reference to FIGS. 8A and 8B, that is, the method of forming the upper electrode 751 and the lower electrode 851 while extending the flexible material layer 601, may also be similarly applied to the structure of FIG. 5I. However, an upper electrode and a lower electrode are not necessarily formed using the method as illustrated in FIGS. 8A and 8B. When materials of the upper electrode and the lower electrode have excellent elasticity and flexibility, even when forming upper and lower electrodes while not extending the flexible material layer, the upper and lower electrodes may be flexibly deformed according to deformation of a device. Also, according to circumstance, only one of the upper and lower electrodes may be formed using the method as illustrated in FIGS. 8A and 8B.

The various flexible semiconductor devices manufactured according to the methods illustrated in FIGS. 6A through 8B may be optoelectronic devices. The vertical semiconductor elements 500 and 501 may be light-emitting elements or photovoltaic elements. When the vertical semiconductor elements 500 and 501 are light-emitting elements, the semiconductor device including the same may be a light-emitting device. When the vertical semiconductor elements 500 and 501 are photovoltaic elements, the semiconductor device including the same may be a photovoltaic device.

The flexible semiconductor devices according to exemplary embodiments may be manufactured using amorphous substrates 100 and 101 as a base, and thus, the flexible semiconductor devices may be manufactured at low costs and have large surface areas. To manufacture semiconductor devices based on a conventional nitride semiconductor, a monocrystalline nitride layer is to be epitaxially formed on a sapphire substrate and a silicon substrate. Accordingly, it is difficult to form a device that is deformable in various manners. Also, manufacturing costs thereof are relatively high, and it is difficult to manufacture a large size device. However, according to one or more exemplary embodiments described herein, inexpensive amorphous substrates 100 and 101 are used, and the flexible material layers 600 and 601 are applied thereon using a coating method, and thus a large-size flexible semiconductor device may be easily manufactured at low costs.

Also, according to one or more exemplary embodiments described herein, stress due to a difference in CTEs between the underlayers 200 and 201*a* and the buffer layers 300 and 301*a* is generated to weaken (degrade) a coupling force between the underlayers 200 and 201*a* and the buffer layers 300 and 301*a*, and then the flexible material layers 600 and 601 are separated from the substrates 100 and 101, and thus the flexible material layers 600 and 601 may be easily separated. This separation operation may be easy also when the substrates 100 and 101 have large surfaces. Thus, according to one or more current embodiments, a flexible semiconductor device having a large surface may be easily manufactured.

Also, a flexible semiconductor device according to an exemplary embodiment described herein uses the vertical semiconductor elements 500 and 501, and thus non-radiative recombination which occurs in light-emitting devices having a planar mesa structure may be prevented or reduced. Accordingly, a flexible semiconductor device having excellent optoelectronic characteristics (light-emitting characteristics and photovoltaic characteristics) and a high efficiency may be obtained.

In addition, when forming the upper and lower electrodes 700 and 800, problems such as a misalignment do not occur, and the overall manufacturing processes thereof are not complicated but are relatively simple.

Figure 10:
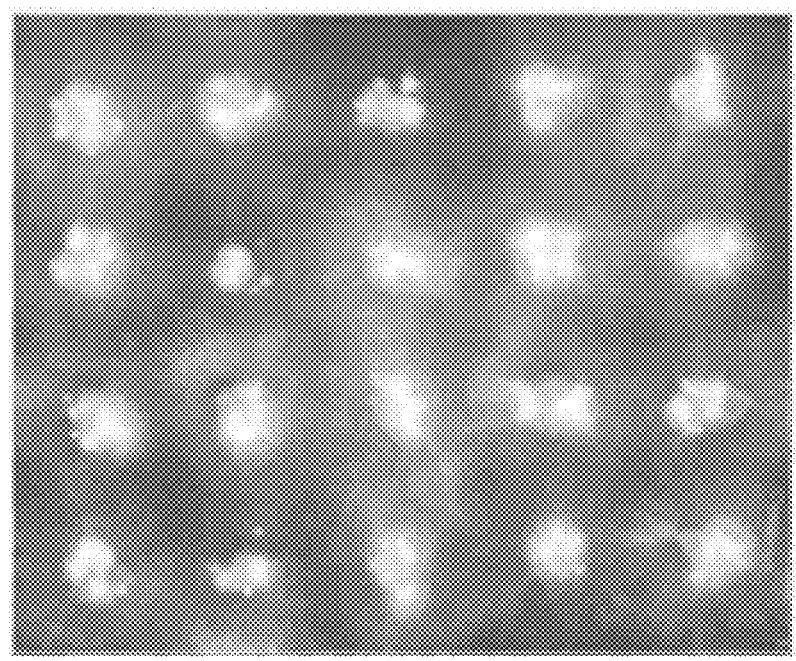
FIG. 10 is a microscopic image showing a flexible semiconductor device (light-emitting device) that is manufactured according to a method of an exemplary embodiment.

FIG. 10 is a microscopic image showing a flexible semiconductor device (light-emitting device) that is manufactured according to a method of an exemplary embodiment. Referring to FIG. 10, light of relatively uniform color is emitted from the plurality of vertical semiconductor elements (light-emitting element). As can be seen from this FIG. 10, the flexible semiconductor devices manufactured according to exemplary embodiments (light-emitting device) have excellent optoelectronic characteristics.

While exemplary embodiments have been particularly shown and described, these embodiments should be considered in descriptive sense only and not for purposes of limitation. For example, it will be understood by those skilled in the art that various changes may be made in structures of the devices of FIGS. 1 through 4. For example, it will be obvious to one of ordinary skill in the art that various changes may be made in the forms and structures of the vertical semiconductor elements S10 and S11 and layer structures thereunder. Also, it would be obvious to one of ordinary skill in the art that various changes may be made in the manufacturing methods described with reference to FIGS. 5A through 8B. For example, while only the use of the underlayer 200 having a greater CTE than that of the buffer layer 300 has been described with respect to the method described with reference to FIGS. 5A through 5J, an underlayer 200 having a smaller CTE than that of the buffer layer 300 may also be used. That is, even when using an underlayer 200 having a smaller CTE than the buffer layer 300, if a difference in the CTEs of the underlayer 200 and the buffer layer 300 is about 1.5 times or more, an adhesive force of the underlayer 200 and the buffer layer 300 may still be weakened (degraded) using the difference in CTEs, and a flexible semiconductor device may be manufactured. In addition, exemplary embodiments described herein may be applied not only to optoelectronic devices but also to other semiconductor devices. Therefore, the scope of the current inventive concept is defined not by the detailed description of the invention but by the appended claims.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A flexible semiconductor device comprising:
   a flexible material layer;
   at least one vertical semiconductor element that is at least partly embedded in the flexible material layer, wherein the vertical semiconductor element comprises a core and a shell;
   a first electrode that is formed on a first surface of the flexible material layer and is electrically connected to a first region of the at least one vertical semiconductor element; and
   a second electrode that is formed on a second surface of the flexible material layer, opposite the first surface of the flexible material layer, and is electrically connected to a second region of the at least one vertical semiconductor element.

2. The flexible semiconductor device of claim 1, wherein the vertical semiconductor element comprises a Group III-V based semiconductor.

3. The flexible semiconductor device of claim 1, wherein the vertical semiconductor element comprises at least one of GaN, InGaN, AlGaN, and AlInGaN.

4. The flexible semiconductor device of claim 1, wherein the core of the vertical semiconductor element comprises a first conductivity type semiconductor and the shell of the vertical semiconductor element comprises a second conductivity type semiconductor, and the first conductivity type semiconductor is connected to the first electrode, and the second conductivity type semiconductor is connected to the second electrode.

5. The flexible semiconductor device of claim 1, wherein a portion of the vertical semiconductor element protrudes from the flexible material layer.

6. The flexible semiconductor device of claim 1, further comprising a buffer layer formed on a lower surface of the vertical semiconductor element,
   wherein the first electrode is electrically connected to the vertical semiconductor element via the buffer layer.

7. A flexible semiconductor device comprising:
   a flexible material layer;
   at least one vertical semiconductor element that is at least partly embedded in the flexible material layer;
   a first electrode that is formed on a first surface of the flexible material layer and is electrically connected to a first region of the at least one vertical semiconductor element;
   a second electrode that is formed on a second surface of the flexible material layer, opposite the first surface of the flexible material layer, and is electrically connected to a second region of the at least one vertical semiconductor element; and
   a buffer layer formed on a lower surface of the vertical semiconductor element,
   wherein the first electrode is electrically connected to the vertical semiconductor element via the buffer layer, and
   wherein the buffer layer is disposed between the first electrode and the flexible material layer, and the flexible semiconductor device further comprises a mask layer between the buffer layer and the flexible material layer, wherein at least one opening region is formed in the mask layer exposing at least one portion of the buffer layer therethrough, wherein the at least one vertical semiconductor element is disposed on at least one portion of the buffer layer exposed by the at least one opening region.

8. The flexible semiconductor device of claim 6, wherein the buffer layer has a patterned structure comprising at least one buffer portion, wherein the at least one buffer portion is disposed in a region corresponding to a region in which the at least one vertical semiconductor element is disposed.

9. A flexible semiconductor device comprising:

a flexible material layer;

at least one vertical semiconductor element that is at least partly embedded in the flexible material layer;

a first electrode that is formed on a first surface of the flexible material layer and is electrically connected to a first region of the at least one vertical semiconductor element; and a second electrode that is formed on a second surface of the flexible material layer, opposite the first surface of the flexible material layer, and is electrically connected to a second region of the at least one vertical semiconductor element, wherein at least one of the first electrode and the second electrode has at least one corrugated surface.

10. The flexible semiconductor device of claim 1, further comprising a supporting film disposed on the second electrode.

11. The flexible semiconductor device of claim 1, wherein the flexible semiconductor device is an optoelectronic device.

12. The flexible semiconductor device of claim 4, wherein the vertical semiconductor element further comprises an active layer between the first conductivity type semiconductor and the second conductivity type semiconductor.

13. The flexible semiconductor device of claim 6, wherein buffer layer comprises a Group III-V based semiconductor.

* * * * *